(12) United States Patent
Parker

(10) Patent No.: US 10,949,123 B2
(45) Date of Patent: Mar. 16, 2021

(54) USING INTERLEAVED WRITES TO SEPARATE DIE PLANES

(71) Applicant: Western Digital Technologies, Inc., San Jose, CA (US)

(72) Inventor: Liam Parker, Edinburgh (GB)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 0 days.

(21) Appl. No.: 16/440,233

(22) Filed: Jun. 13, 2019

(65) Prior Publication Data

US 2020/0125294 A1    Apr. 23, 2020

Related U.S. Application Data

(60) Provisional application No. 62/747,525, filed on Oct. 18, 2018.

(51) Int. Cl.
  *G06F 3/06* (2006.01)
  *G06F 12/0804* (2016.01)
  *G06F 11/10* (2006.01)
  *G11C 29/52* (2006.01)
  *G06F 12/02* (2006.01)

(52) U.S. Cl.
  CPC .......... *G06F 3/0659* (2013.01); *G06F 3/0604* (2013.01); *G06F 3/064* (2013.01); *G06F 3/0679* (2013.01); *G06F 11/1068* (2013.01); *G06F 12/0804* (2013.01); *G11C 29/52* (2013.01); *G06F 12/0246* (2013.01); *G06F 2212/1044* (2013.01)

(58) Field of Classification Search
  CPC .. G06F 12/0246; G06F 3/0607; G06F 3/0604; G06F 3/0679; G06F 3/0688
  USPC ....................................................... 711/103
  See application file for complete search history.

(56) References Cited

U.S. PATENT DOCUMENTS

| | | | |
|---|---|---|---|
| 8,751,731 | B2 | 6/2014 | Asnaashari et al. |
| 9,176,864 | B2 | 11/2015 | Gorobets et al. |
| 10,032,488 | B1* | 7/2018 | Kathawala ............ G06F 3/0611 |
| 2012/0023144 | A1 | 1/2012 | Rub |
| 2012/0303931 | A1* | 11/2012 | Asnaashari ......... G06F 12/0246 |
| | | | 711/209 |
| 2016/0179386 | A1 | 6/2016 | Zhang |
| 2016/0283143 | A1* | 9/2016 | Guo ..................... G06F 11/108 |

(Continued)

OTHER PUBLICATIONS

Park, JungWook et al, "Sub-grouped Superblock Management for High-performance Flash Storages" IEICE Electronics Express, vol. 6, No. 6, pp. 297-303, Mar. 25, 2009 (7 pages).

*Primary Examiner* — Than Nguyen
(74) *Attorney, Agent, or Firm* — Patterson & Sheridan, LLP; Steven H. Versteeg

(57) ABSTRACT

In one embodiment, a solid state device includes a controller and a non-volatile memory. The non-volatile memory includes a plurality of dies. Each die includes a plurality of planes. A first super-plane-block is structured from a first plane of the plurality of dies. A second super-plane-block is structured from a second plane of the plurality of dies. A plurality of memory operation instructions that, when executed by the controller, cause the controller to receive a first data stream, write the first data stream to the first super-plane-block, receive a second data stream, and write the second data stream to the second super-plane-block.

17 Claims, 13 Drawing Sheets

(56) References Cited

U.S. PATENT DOCUMENTS

| | | | |
|---|---|---|---|
| 2017/0235486 A1* | 8/2017 | Martineau | G06F 3/061 |
| | | | 711/103 |
| 2018/0267705 A1* | 9/2018 | Liu | G06F 3/0679 |
| 2018/0276118 A1* | 9/2018 | Yanagida | G06F 3/0688 |
| 2019/0317889 A1* | 10/2019 | Chang | G06F 12/023 |

* cited by examiner

8 PLANE DIE STORING 8 STREAMS

8 PLANE DIE STORING 5 STREAMS WRITING AT DIFFERENT RATES

USING INTERLEAVED WRITES TO SEPARATE DIE PLANES

CROSS-REFERENCE TO RELATED APPLICATIONS

This application claims the benefit of U.S. Provisional Patent Application Ser. No. 62/747,525, filed Oct. 18, 2018, which is herein incorporated by reference.

BACKGROUND OF THE DISCLOSURE

Field of the Disclosure

Embodiments of the present disclosure generally relate to solid state device (SSD) management of non-volatile memory (NVM) blocks for writing multiple data streams.

Description of the Related Art

SSDs are negatively affected by write amplification due to the block erase nature of NAND operation. SSDs free up storage space consumed by invalid pages through the process of garbage collection. To free up space in a block that has both valid (existing) data and invalid data (data marked to be erased), the SSD erases the entire block and moves or re-writes the valid data to a new block. The process of re-writing valid data consumes more physical capacity as compared to the logical capacity of the SSD and amplifies the total writes performed by SSDs. SSDs are over-provisioned to compensate for this need of more physical capacity compared to logical capacity. Depending on the amount of over-provisioning on a SSD, the write amplification factor can be anywhere from almost 1 to infinity.

Data streams are sequential workloads received by a SSD from a host to increase the throughput of a SSD. However, if multiple data streams are written together to the same pool of blocks or superblock of a SSD, then the sequential workloads change to random workloads resulting in performance degradation of the SSD and increased write amplification of the SSD. Therefore, there is a need for an improved structure of NVM blocks of SSDs and an improved method of operating SSDs.

SUMMARY OF THE DISCLOSURE

The present embodiments generally include workloads of multiple data streams to super-plane-blocks spanning different planes of the user data dies and/or XOR die(s).

In one embodiment, a solid state device includes a controller and a non-volatile memory. The non-volatile memory includes a plurality of dies. Each die includes a plurality of planes. A first super-plane-block is structured from a first plane of the plurality of dies. A second super-plane-block is structured from a second plane of the plurality of dies. A plurality of memory operation instructions that, when executed by the controller, cause the controller to receive a first data stream, write the first data stream to the first super-plane-block, receive a second data stream, and write the second data stream to the second super-plane-block.

In another embodiment, a solid state device includes a controller, a data stream support means, and a plurality of memory operation instructions. The data stream support means is for simultaneously writing separate data on NAND flash memory. The plurality of memory operation instructions that, when executed by the controller, cause the controller to simultaneous write separate data to the data stream support means.

In one embodiment, a method of operating a solid state device includes structuring a non-volatile memory into a first super-plane-block and a second super-plane-block. The first super-plane-block is structured from a first plane of a plurality of dies and the second super-plane-block is structured from a second plane of the plurality of dies. A first data stream is written to the first super-plane-block. A second data stream is written to the second super-plane-block.

In another embodiment, a method of operating a solid state device includes providing a non-volatile memory comprising a plurality of dies having multiple planes. The non-volatile memory is structured into a plurality of super-plane-blocks. Each super-plane-block spans separate planes of the plurality of dies. A plurality of data streams is written into the plurality of super-plane-blocks.

In still another embodiment, a method of operating a solid state device include providing a non-volatile memory comprising a plurality of user data dies and a XOR die. A parity information of a first data stream is written on a first plane or on a first set of planes of the XOR die. A parity information of a second data stream is written on a second plane or on a second set of planes of the XOR die.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The term "comprises/comprising" includes the subset meaning of "consists/consisting essentially of" and includes the subset meaning of "consists/consisting of."

Certain embodiments of structuring non-volatile memory can extend the endurance, reliability, and/or performance of solid-state devices supporting multiple data streams. In certain embodiments, workloads of multiple data streams to super-plane-blocks spanning different planes of the user data dies and/or XOR die(s) reduces the write amplification factor, reduces die contention of writing to the same plane, reduces the erasable unit of super-plane-blocks, simplifies XOR operations and data recovery, and/or reduces the size and the cost of the data stream cache.

Figure 1:
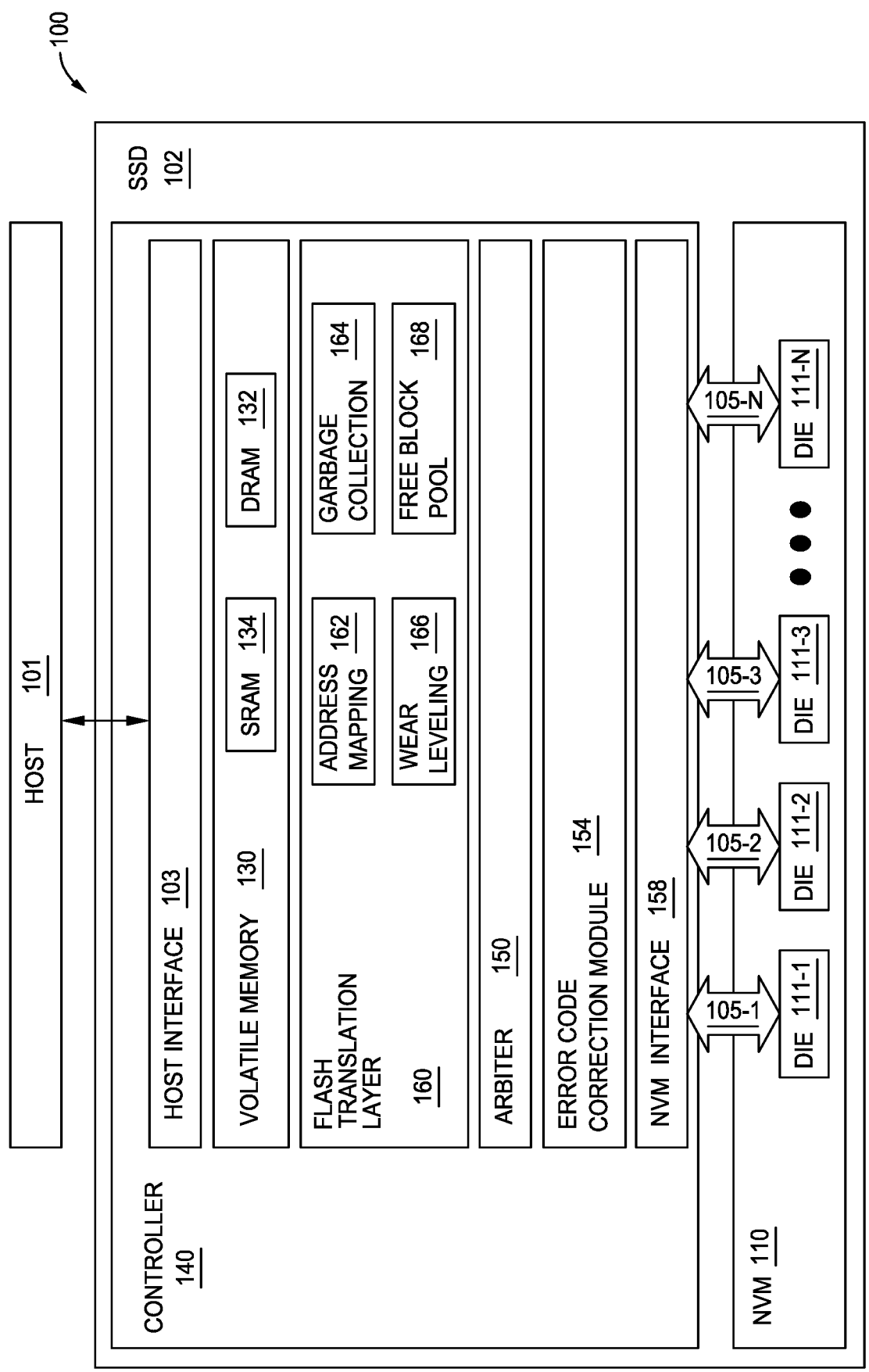
FIG. 1 is a schematic diagram illustrating certain embodiments of a system comprising a host and a solid state device.

FIG. 1 is a schematic diagram illustrating certain embodiments of a system 100 comprising a host 101 and a solid state device (SSD) 102. SSD 102 including non-volatile memory (NVM) 110. NVM 110 is configured for long-term data storage of information and retains information after power on/off cycles. NVM 110 includes one or more arrays of non-volatile memory devices, such as multiple memory dies 111-1 to 111-N. NVM 110 can include one or more types of memory devices. Examples of memory devices include flash memories, phase change memories, ReRAM memories, MRAM memories, electrically programmable read only memories (EPROM), electrically erasable programmable read only memories (EEPROM), and other solid-state memories. NVM devices may also have different configurations. For example, flash memory devices may be configured in a NAND or a NOR configuration. NAND flash memory are used in enterprise applications for writing and reading large amounts of data due to the low cost and high performance of NAND flash in comparison to NOR flash. Memory die(s) 111-1 to 111-N may represent any configurations or any types of memory dies or devices arranged to store data accessible via channels 105-1 to 105-N.

SSD 102 operates with host 101 through a host interface 103, such as including mac and phy components, for ingress of communications from host 101 to SSD 102 and egress of communications from SSD 102 to host 101. SSD 102 may be in the form of a removable memory such as a memory card, may be in the form of an embedded memory system, or may be any suitable form factor.

SSD 102 includes a controller 140 to control NVM 110. Host interface 103 and NVM interface 158 may be considered part of controller 140. Controller 140 controls program/write, read, and erase operations to memory dies 111-1 to 111-N via channels 105-1 to 105-N. Controller 140 may include volatile memory 130 for short-term storage or temporary memory during operation of SSD 102. Volatile memory 130 does not retain stored data if powered off. Examples of volatile memories include dynamic random access memories (DRAM) 132, static random access memories (SRAM) 134, and other forms of volatile memories. The system 100 may cache or queue data streams in a cache in the host 101 and/or in a cache in the SSD 102, such as SRAM 134, DRAM 132, and/or NVM.

Controller 140 includes a flash translation layer (FTL) 160. FTL 160 determines the physical block addresses (PBAs) associated with the logical block addresses (LBAs) of host commands and storage device tasks. FTL 160 may be stored in NVM 110 and loaded or partially loaded to volatile memory 130. FTL 160 may include a logical to physical (or virtual to physical) data address mapping 162. Host device 101 may refer to a unit of data using a logical data address, and controller 140 may utilize mapping 162 to direct writing of data to and reading of data from NVM 110. FTL 160 may include garbage collection tables 164 to move valid data from a selected block having invalid data to an open block or to a partially filled block and erasing the selected block. FTL 160 may include a wear leveling counter 166 to record the number of program erase cycles of a block to level the usage of the blocks of NVM 110. FTL 160 may include a free block pool 168 which lists the blocks that are open for programming or available for programming.

Controller 140 may further include an arbiter 150 to facilitate data transfers between the host 101 and SSD 102 in program/write, read, and erase operations to memory dies 111. Controller 140 may further include an error correction module 136 to correct the data fetched from the memory arrays. Error correction module 136 may be implemented in software or hardware. Error correction module 136 calculates parity information, such as exclusive OR (XOR) parity information or redundancy checksum parity information, of the host data to be written to NVM 110. The parity information along with the decoding algorithm verifies and corrects data fetched from the memory arrays. Examples of decoding used by the error correction module include Hamming, Reed-Solomon, Bose-Chaudhuri-Hocquenghem, and Low-Density Parity Check decoding. Controller 140 also includes an error code correction module 154.

The techniques described herein may also be embodied or encoded in an article of manufacture including a computer-readable storage medium encoded with instructions. Instructions embedded or encoded in an article of manufacture including a computer-readable storage medium, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media. In some examples, a computer-readable storage medium may include a non-transitory medium. The term "non-transitory" may indicate that the storage medium is not embodied in a carrier wave or a propagated signal.

In certain embodiments, controller 140 executes computer-readable program code (e.g., software or firmware) executable instructions (herein referred to as "instructions"). The instructions may be executed by various components of controller 140, such as processors, neural networks, logic gates, switches, application specific integrated circuits (ASICs), programmable logic controllers, embedded microcontrollers, and other components of controller 140.

Figure 2:
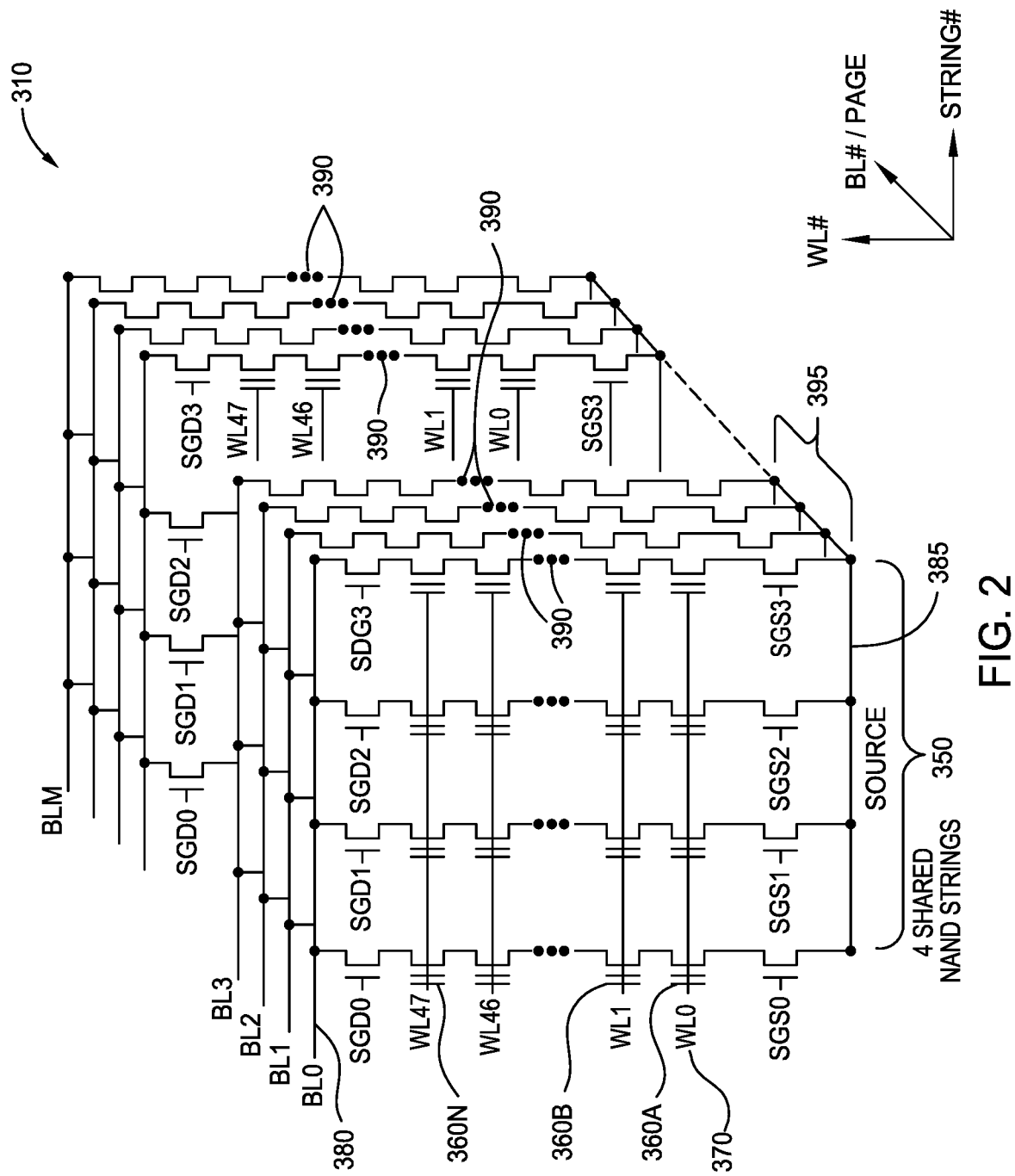
FIG. 2 is a schematic diagram illustrating certain embodiments of a memory array.

FIG. 2 is a schematic diagram illustrating certain embodiments of a memory array 310, such as the memory arrays of the memory dies 111 of FIG. 1. The memory array 310 as shown is a 3D or vertical NAND memory array or a bit cost scalable (BiCS) cell array, but other memory arrays may be used. Memory array 310 is made up of a plurality of pages 390. Each page 390 includes a set of NAND strings 350 (four NAND strings are shown). Each set of NAND string 350 is connected in common to a bit line 380. Each page 390 has its own bit line 380 which number from BL0 to BLM depending on the number of pages 390. Each NAND string 350 includes a select gate drain transistor (SGD), a plurality of memory cells 360A-360N, and a select gate source transistor (SGS). A row of memory cells is connected in common to a word line (WL) 370. The number of word lines (WL0, WL1, etc.) depending on the number of memory cells in a NAND string 350. The source electrode of each SGS transistors is coupled together along a line 385.

Memory cells 360A-360N are made up of a transistor that has a charge storage element to store a given amount of charge representing a memory state. The memory cells 360A-360N may be operated in a single-level cell (SLC) storing one bit of memory per cell, a multi-level cell (MLC) storing two bits of memory per cell, a triple-level cell (TLC) storing three bits of memory per cell, a quad-level (QLC) cell storing four bits of memory per cell, or any type of memory cell storing any number of bits per cell. Page 390 is a group of memory cells that are programmed and read as a group. Multiple pages 390 make up a block 395. The memory cells in an individual block 395 are typically erased together.

Embodiments described herein are not limited to three dimensional memory arrays described in FIG. 2 but cover all relevant memory structures. Other arrays are possible, such as a three dimensional NAND string formed in a U-shape, two dimensional memory arrays, or other memory arrays made of any storage class memory. Multiple memory arrays, such as the same type or mixed type of memory arrays, may be formed on separate die and then packaged together.

Figure 3:
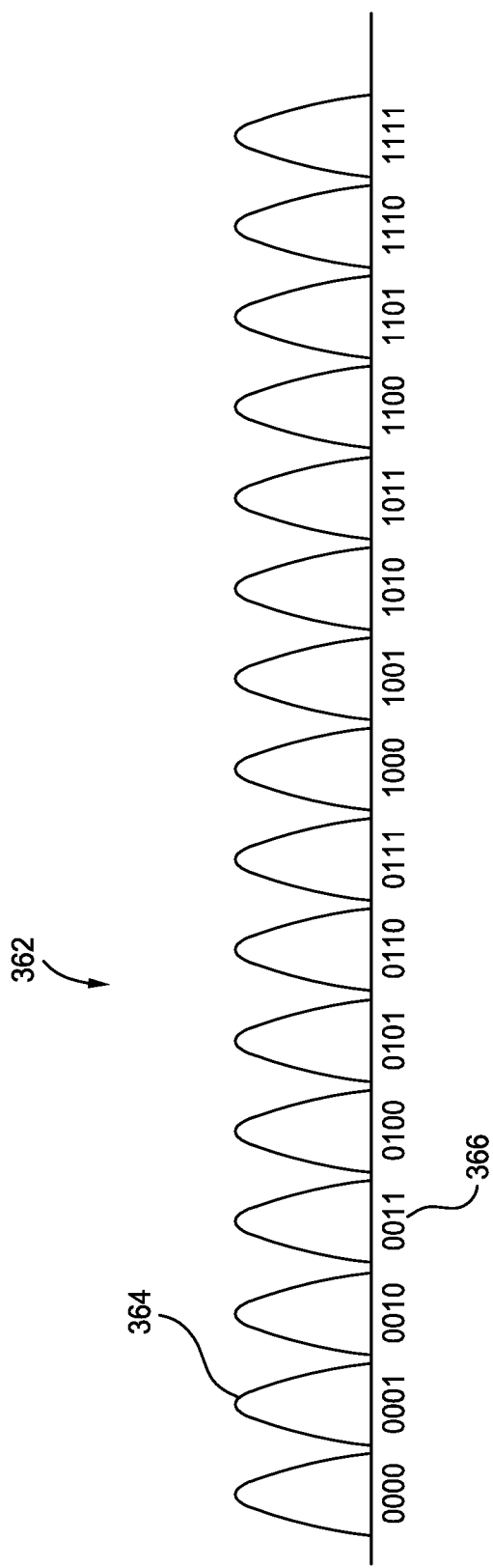
FIG. 3 is a schematic diagram illustrating certain embodiments of threshold voltage distributions of a quad-level cell (QLC).

FIG. 3 is a schematic diagram illustrating certain embodiments of threshold voltage distributions of a quad-level cell (QLC) 362, such as the memory cells 360 of FIG. 2 making up one or more of the memory dies 111 of FIG. 1. The QLC 362 stores four bits per cell as demarcated by the possible threshold voltages 364 partitioned into sixteen regions to demarcate sixteen possible memory states. One example of 4-bit gray coding 366 represented by the sixteen possible memory states 364 is shown although several other 4-bit gray coding are possible. Each of the sixteen memory states represents a quadruplet of upper, upper middle, lower middle, and lower bits. The threshold voltage of the four code bits (i.e., upper, upper middle, lower middle, and lower bits) of a memory array may be read or programmed in multiple rounds. For example, during reading, the threshold voltages representing the lower bits of the memory array may be read in one round and the threshold voltages representing the upper bits may be read in another round. For example, in programming, the threshold voltages of the memory array may be programmed and verified in multiple rounds until arriving at the final desired threshold voltage. Due to the multiple possible threshold voltage levels, execution times for QLC memory cells are longer than execution times of TLC memory cells. The execution time of TLC memory cells are longer than the execution times of MLC memory cells. The execution time of MLC memory cells are longer than the execution time of SLC memory cells.

Each time a memory cell is programmed, the memory gate is worn or damages. For memory cells operating multiple threshold voltage states (i.e., storing two or more bits per cell), the memory gates experience a high level of wear due to the multiple rounds of programming required to achieve the final desired threshold voltage state. Similarly, the tolerance for error of the memory gates due to the multiple threshold voltage states and the measurement threshold between threshold voltages states are smaller for memory cells storing more bits/cell. Memory gates storing multiple threshold voltage levels cells have a lower tolerance for charge leakage due to accompanying shifting of the threshold voltage. Due to the wear on the memory gate and due to the lower tolerance for error in measuring threshold voltage states, the endurance (i.e., the number of program/erase cycles over the lifetime of the memory device) of QLC memory cells is lower than the endurance of TLC memory cells. The endurance of TLC memory cells is lower than MLC memory cells. The endurance of MLC memory cells is lower than SLC memory cells.

FIGS. 4-12 are schematic diagram illustrating various embodiments of structuring NVM to support writing data streams (i.e., sequential workloads) from a host to a SSD, such as the system 100 of FIG. 1 utilizing QLC memory cells of FIG. 3 and like numerals for elements are used for ease of description. The various embodiments are also applicable to other systems and to other types of memory devices/cells. Writing streamed data to NVM 110 of SSD 102 from host 101 may be from a cache of host 101, a cache from SSD 102, and/or a direct write of data from host 101 to SSD 102 without caching (such as when SSD 102 acts as virtual memory of host 101). The data streams may be identified by a stream ID to help manage the data streams.

Figure 4:
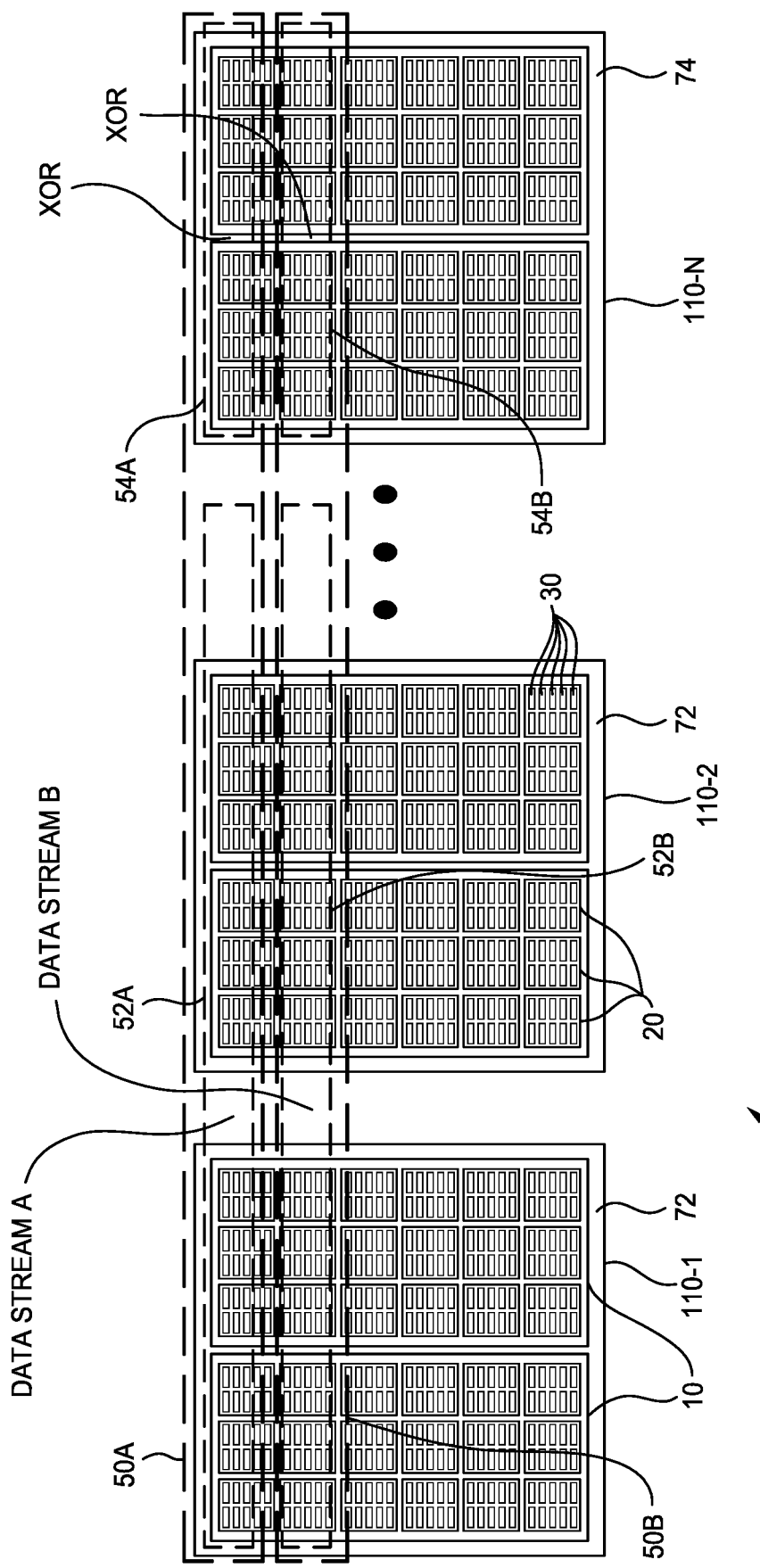
FIG. 4 is a schematic diagram illustrating structuring non-volatile memory into a plurality of superblocks.

FIG. 4. is a schematic diagram illustrating structuring NVM 110 into a plurality of superblocks 50A. Each die 111-1 to 111-N comprises a plurality of planes 10. Two planes 10 for each die 111 are shown in FIG. 4, but the die can include any number of planes, such as 2, 4, 6, 8 or more planes. Concurrent operations can take place on each plane 10. Each plane 10 contains a plurality of blocks 20, which are typically the smallest unit that can be erased. Each block contains a plurality of pages 30, which are typically the smallest unit that can be programmed or read.

An SSD may be structured in superblocks 50 to provide dedicated stream support to increased performance of the SSD. For example, as shown in FIG. 4, a superblock 50 comprises one or more blocks 20 striped across each plane 10 of each of the dies 111-1 to 111-N to store data streams to increase the performance and bandwidth of the SSD. For high performance SSDs, a data stream is written to multiple pages 30 across multiple dies 111 of the superblock 50 simultaneously or concurrently. Similarly, read operation of pages 30 across multiple dies 111 of superblock 50 can be performed simultaneously or concurrently.

Superblock 50 enables parallel operations to the dies 111-1 to 111-N on the NVM 110 by spanning all channels 105-1 to 105-N between the NVM interface 158 and the NVM 110. Parallel operations increase the performance of the SSD. A superblock 50 may also store meta-data for logical-to-physical address mapping to reduce the workload of the FTL 160 further increasing performance of the SSD.

Parity information, such as exclusive OR (XOR) parity information, may be stored on the same die as a data stream in the superblock 50 or combined together on a separate die in the superblock 50. In enterprise applications of SSDs, it is desirable to provide full die redundancy to protect user data in case one of the dies fails or is unreadable. Full die redundancy may be provided by storing parity information on a separate die(s) from the user data. For example, as shown in FIG. 4, data stream 52 is stored in a first set of user data dies 72 of the superblock 50 and parity information 54 of a data stream is combined together and stored in a separate XOR die(s) 74 of the superblock 50. If one of the user data dies 72 storing the data stream 52 fails the data stream 52 may be recovered from the parity information 54 on the XOR die(s) 74. If the data stream 52 and the parity information 54 were written on the same die, a data stream would not be recoverable in the even to die failure.

An SSD may provide multiple superblocks 50 to support multiple data streams. For example, superblock 50A may support data stream 52A and superblock 50B may support data stream 52B. One drawback of the multiple superblocks 50 supporting multiple data streams 52 is die contention for operations (i.e., programming, reading, erasing) of multiple stream data to the same plane 10 of the same die 111. For example, in the case of two data streams, such as data stream 52A and data stream 52B, being written to the same plane 10 on the same die 111, the execution of the data writes cannot occur simultaneously to the same plane 10. Instead, the SSD writes part of data stream 52A to plane 10, then SSD writes part of data stream 52B to plane 10, and then SSD writes part of data stream 52A to plane 10. The write execution swaps back-and-forth between writing data stream 52A and writing data stream 52B to plane 10. Since SSD 102 cannot simultaneously write two data streams from host 101 to the same plane 10 of the same die 111, part of the data streams 52A, 52B are cached in the host 101 or cached in the SSD 102 during swapping back-and-forth between write executions of the two data streams causing a performance penalty. Die contention may undesirably cause a performance reduction of about 20% for the die 111.

In enterprise applications of SSDs, large amounts of streamed data are stored in superblocks 50. SSDs comprised of NAND memory devices storing multiple bits per cell, such as QLC cells or TLC cells, have higher capacity suitable for storing large amounts of data. A high input/output operations per seconds (IOPS) performance of the SSD is desirable to improve the performance of overall system of the host and the SSD. As the NAND memory devices store more bits/cell, the execution time of programming, reading, and erasing undesirably increases. Also, as the NAND memory devices store more bits per cell, the endurance (i.e., number of program/erase cycles over the lifetime) of the NAND devices undesirably decreases. SSDs comprising superblocks 50 from QLC cells suffer reduced performance due to die contention.

Because QLC cells have low write performance and low endurance, it is desirable to erase the entire superblock 50 as one unit without any garbage collection. Any garbage collection of the superblock 50 reduces the performance of the die by adding read and write operations to move valid data to an open page and reduces the endurance by adding to the wear of blocks 20 of superblock 50.

Figure 5A:
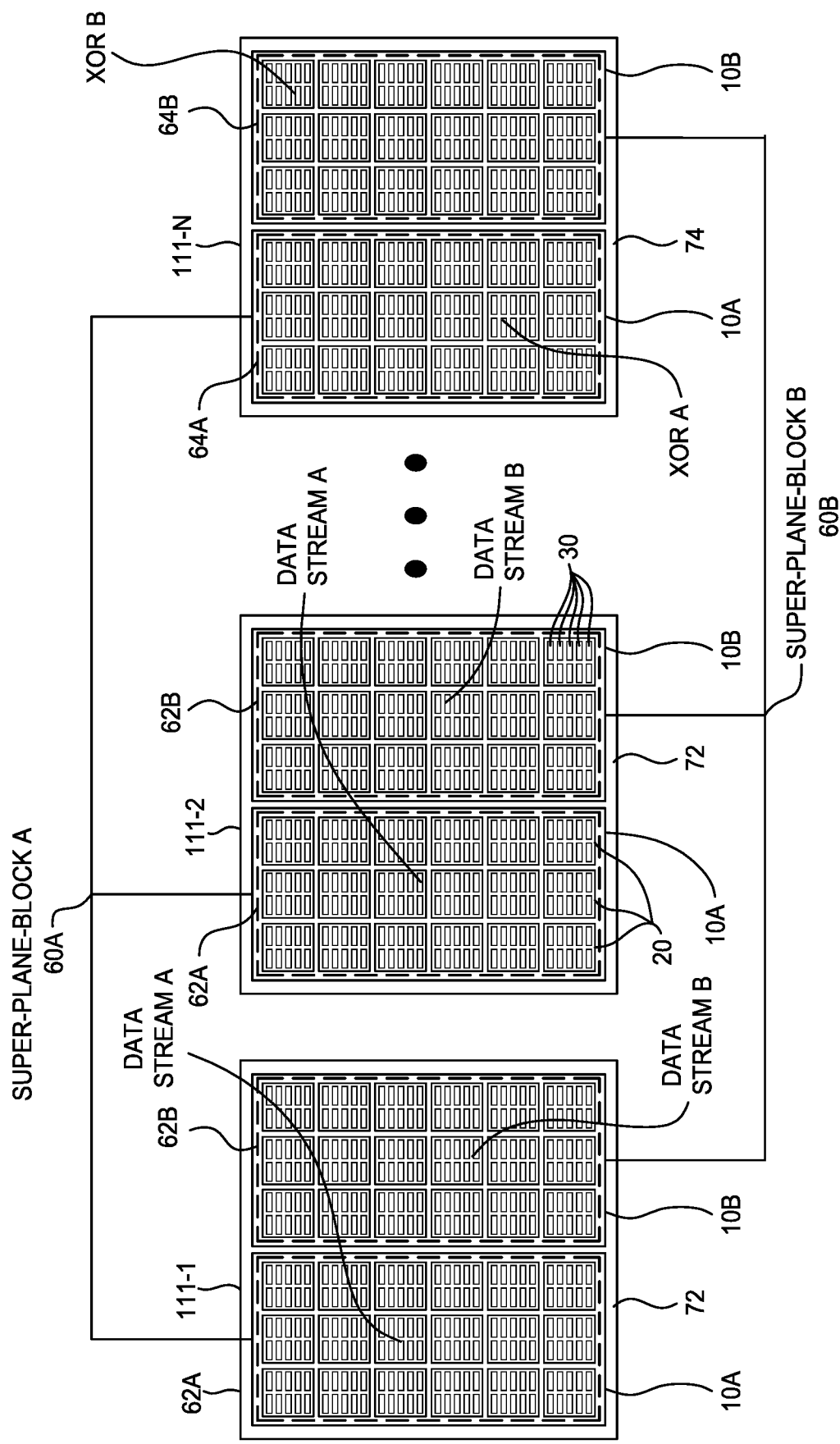
FIG. 5A is a schematic diagram illustrating certain embodiments of structuring non-volatile memory into two super-plane-blocks spanning dies have two planes.

FIG. 5A is a schematic diagram illustrating certain embodiments of structuring NVM 110 into two super-plane-blocks 60 spanning dies have two planes. Each die 111-1 to 111-N comprises a plurality of planes 10. Two planes 10 for each die 111 are shown in FIG. 5A, but die 111 can include any number of planes, such as 2, 4, 6, 8 or more planes. Concurrent operations can take place on each plane 10. Each plane 10 contains a plurality of blocks 20, which are typically the smallest unit that can be erased. Each block contains a plurality of pages 30, which are typically the smallest unit that can be programmed or read.

In certain embodiments, the super-plane-block 60 comprises one or more blocks 20 spanning a certain plane 10 of each of the dies 111-1 to 111-N to store streamed data to increase the performance of SSD 102. For example, as shown in FIG. 5A, super-plane-block 60 comprises one or more blocks 20 striped across each plane 10 of each of the dies 111-1 to 111-N to store data streams to increase the performance of the SSD. For high performance of SSD 102, a data stream is written to the multiple pages 30 across multiple dies 111 of super-plane-block 60 simultaneously or concurrently. Similarly, read operation of pages 30 across multiple dies 111 of super-plane block 60 can be performed simultaneously or concurrently.

Super-plane-block 60 enables parallel operations to dies 111-1 to 111-N on NVM 110. Parallel operations increase the performance of the SSD. Super-plane-block 60 may also store meta-data for logical-to-physical address mapping to reduce the workload of FTL 160 further increasing performance of SSD 102.

In certain embodiments, parity information 64, such as exclusive OR (XOR) parity information, of the data stream is combined together on a separate die in the super-plane-block 60 from the data stream in the super-plane-block 60 for full die redundancy, although in other embodiments parity information may be stored on the same die as the data stream. In enterprise applications of SSDs, it is desirable to provide full die redundancy to protect user data in case one of the dies fails or is unreadable. Full die redundancy may be provided by storing parity information on a separate die(s) from the user data. For example, as shown in FIG. 5A, data stream 62 is stored in a set of user data dies 72 of the super-plane-block 60 and parity information 64 of the data stream is combined together and stored in a separate XOR die(s) 74 of super-plane-block 60. If one of user data dies 72 storing data stream 62 fails the data stream 62 may be recovered from parity information 64 on XOR die(s) 74. If data stream 62 and the parity information 64 were written on the same die, the data stream would not be recoverable in the event of die failure.

In certain embodiments, NVM 110 may be made up of different types of dies 111. For example, user data dies 72 storing data streams 62 may comprise memory cells storing multiple bits per cell, such as QLC or TLC memory cells. XOR die(s) 74 storing parity information 64 may comprise memory cells storing less bits per cell than the memory cells of user data dies 72. For example, XOR die(s) 74 may comprise MLC or SLC memory cells so that the parity information 64 is written to higher endurance memory cells in case data recovery occurs in the event of a die failure of user data dies 72 storing data streams 62.

SSD 102 may provide multiple super-plane-blocks 60 to support multiple data streams. For example, for a die with two planes, plane 10A and plane 10B, are shown in FIG. 5A, super-plane-block 60A comprises one or more blocks 20 spanning plane 10A of all of the user data dies 72 and super-plane block 60B comprises one or more blocks 20 spanning plane 10B of all of user data dies 72. Super-plane-blocks 60A, 60B can support two data streams, data stream 62A and data stream 62B, with operations being executed at the same time to the same die since operations are occurring on different planes 10A, 10B.

Since data stream 62A and data stream 62B are written on different planes 10A, 10B, there is no die contention causing undesirable data caching due to swapping of executing operations to the same plane. SSD 102 can write the pages 30 of two data streams 62A, 62B across all of the user data dies 72 to separate planes 10A, 10B. Data stream 62A and data stream 62B are interleaved across all channels 105 between the NVM interface 158 and the user data dies 72 of the NVM 110 to provide a high performance SSD 102 without die contention due to concurrent operations to the same plane from different data streams. Parity information 64A of data stream 62A and parity information 64B of data stream 62B are interleaved across all channels 105 between NVM interface 158 and XOR die(s) 74 of NVM 110 to provide a high performance SSD 102 avoiding die contention due to concurrent operations to the same plane from different data streams. The concurrent interleaved operations of super-plane-block 60A and super-plane-block 60B help to increase the performance of SSDs 102 comprising NVM of user dies 72 storing multiple bits per memory cell, such as QLC or TLC memory cells.

Figure 5B:
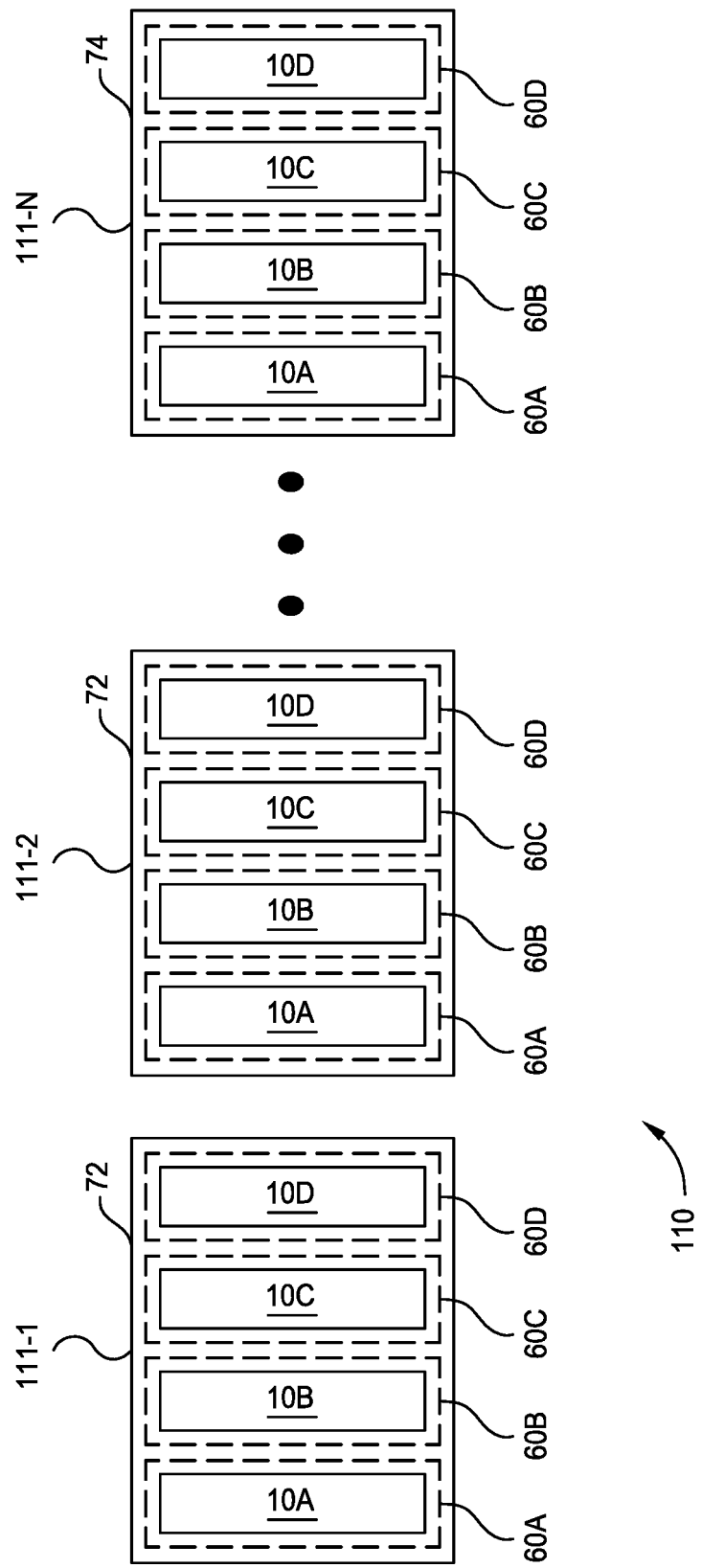
FIG. 5B is a schematic diagram illustrating certain embodiments of structuring non-volatile memory into four super-plane-blocks spanning dies have four planes.

Although two planes, plane 10A and plane 10B, are shown in FIG. 5A, dies 111 may include any number of planes such as 2, 4, 6, 8, or more planes. For example, SSD 102 having four planes per die 111 can have four super-plane blocks 60 is shown in FIG. 5B. FIG. 5B is a schematic diagram illustrating certain embodiments of structuring non-volatile memory into four super-plane-blocks 60 spanning dies 111 having four planes 10. Super-plane-blocks 60A, 60B, 60C, 60D respectfully span across planes 10A, 10B, 10C, 10D. Four or less data streams may be written into user data dies 72 of super-plane-blocks 60A, 60B, 60C, 60D. Parity information of four less data streams may be written into the XOR dies 74 of super-plane-blocks 60A, 60B, 60C, 60D. For example, SSD 102 having six planes per die 111 can have six super-plane blocks 60. For example, a SSD 102 having eight planes per die can have eight super-plane blocks.

Each super-plane-blocks 60A-N of FIGS. 5A and 5B may be erased as an erase unit in event of invalidation or updating of the data stream written into such super-plane-block 60. Erasing the super-plane-block 60 as an erase unit can provide zero data relocation from garbage collection. A super-plane-block 60 as an erase unit is erased without data relocation and marked an available block in the free block or free plane pool. Erasing the super-plane-block 60 as an erase unit lowers the write amplification factor to one as SSD 102 does not perform any additional writes. The total NAND flash writes are reduced and therefore increasing performance and endurance requirements of SSD 102.

In certain embodiments, the size of the erase unit of a super-plane-block 60 is equal to the size of plane 10 of die 111 multiplied by the number of dies of super-plane-block 60. For example, the erase unit of super-plane-block 60 is equal to half the size of die 111 multiplied by the number of dies of the super-plane-block 60 for die 111 having two planes. For example, the erase unit of super-plane-block 60 is equal to ¼ the size of die 111 multiplied by the number of dies of super-plane-block 60 for die 111 having four planes. For example, the erase unit of super-plane-block 60 is equal to ⅙ the size of die 111 multiplied by the number of dies of the super-plane-block 60 for die 111 having six planes. For example, the erase unit of super-plane-block 60 is equal to ⅛ the size of a die 111 multiplied by the number of dies of the super-plane-block 60 for die 111 having eight planes. In enterprise applications of SSDs, minimizing the size of the erase unit increases the performance of the SSDs since a cache size of the host 101 or the SSD 102 that needs to be flushed to the super-plane-block 60 is smaller for the greater number of planes 10 of a die 111. In comparison, the erase unit of a superblock 50 of FIG. 4 is larger for the greater number of planes of similar capacity die.

Figure 6:
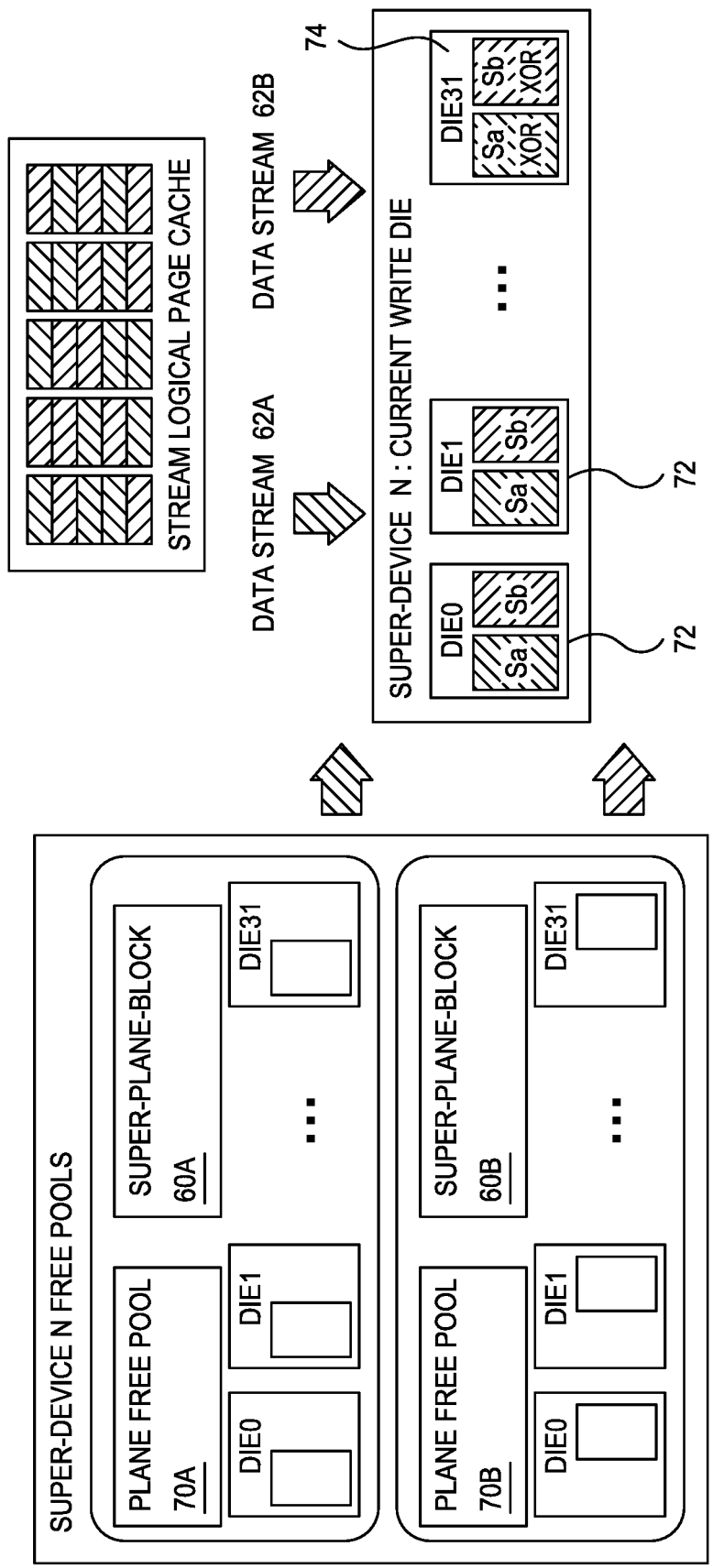
FIG. 6 is a schematic diagram of certain embodiments of supporting two data streams in supper-plane-blocks of the non-volatile memory of FIG. 5A and/or FIG. 5B.

FIG. 6 is a schematic diagram of certain embodiments of supporting two data streams in super-plane-blocks 60 of NVM 110 of FIG. 5A and/or FIG. 5B and like numerals for elements are used for ease of description. When a new super-plane-block 60 is required by system 100, planes 10 taken from a plane free pool 70 and striped together as super-plane-block 60. For example, plane free pool 70A contains planes 10A of dies 111 which are striped together to form super-plane-block 60A. Plane free pool 70B contains plane 10B of dies 111 which are striped together to form super-plane-block 60B.

Forming super-plane block 60A and super-plane-block 60B interleaves writing data stream 62A and data stream 62B across channels 105 of user data dies 72 on different planes 10 removing die contention. Super-plane-block 60A and super-plane-block 60B can be written with separate data stream 62A and data stream 62B while avoiding writing data of two data streams to the same plane. The two data streams are written to the same set of user data dies 72 and XOR die(s) 74 without having to swap between blocks 20 on the same die on the same plane for different data streams. In certain embodiments, data stream 62 A is always on plane 10A and data stream 62B is always on plane 10B. In certain embodiments, data stream 62A may write in parallel to plane 10A on every user data dies 72 concurrently with data stream 62B writing in parallel to plane 10B on every user data dies 72. Die contention from swapping between a plurality of data streams on the same plane is avoided and the performance of the SSD is improved. In certain embodiments, two data streams to parallel blocks on separate planes 10 of the same die provides another performance enhancement since shared signal commands may be used to program, read, or erase the blocks.

In certain embodiments, forming super-plane block 60A and super-plane-block 60B interleaves parity information 64A of data stream 62A and data stream 62B across channels 105 of the XOR die 74 on different planes 10 removes die contention for writing parity information 64 into XOR die(s) 74. Parity information 64A of data stream 62A is written in plane 10A of XOR die 74 of the super-plane-block 60A and parity information 64B of data stream 62B is written in plane 10B of XOR die 74. XOR die 74 are separate from user data dies 72 storing streamed data for full die redundancy in case user data dies 72 or the XOR die 74 fails.

Figure 7:
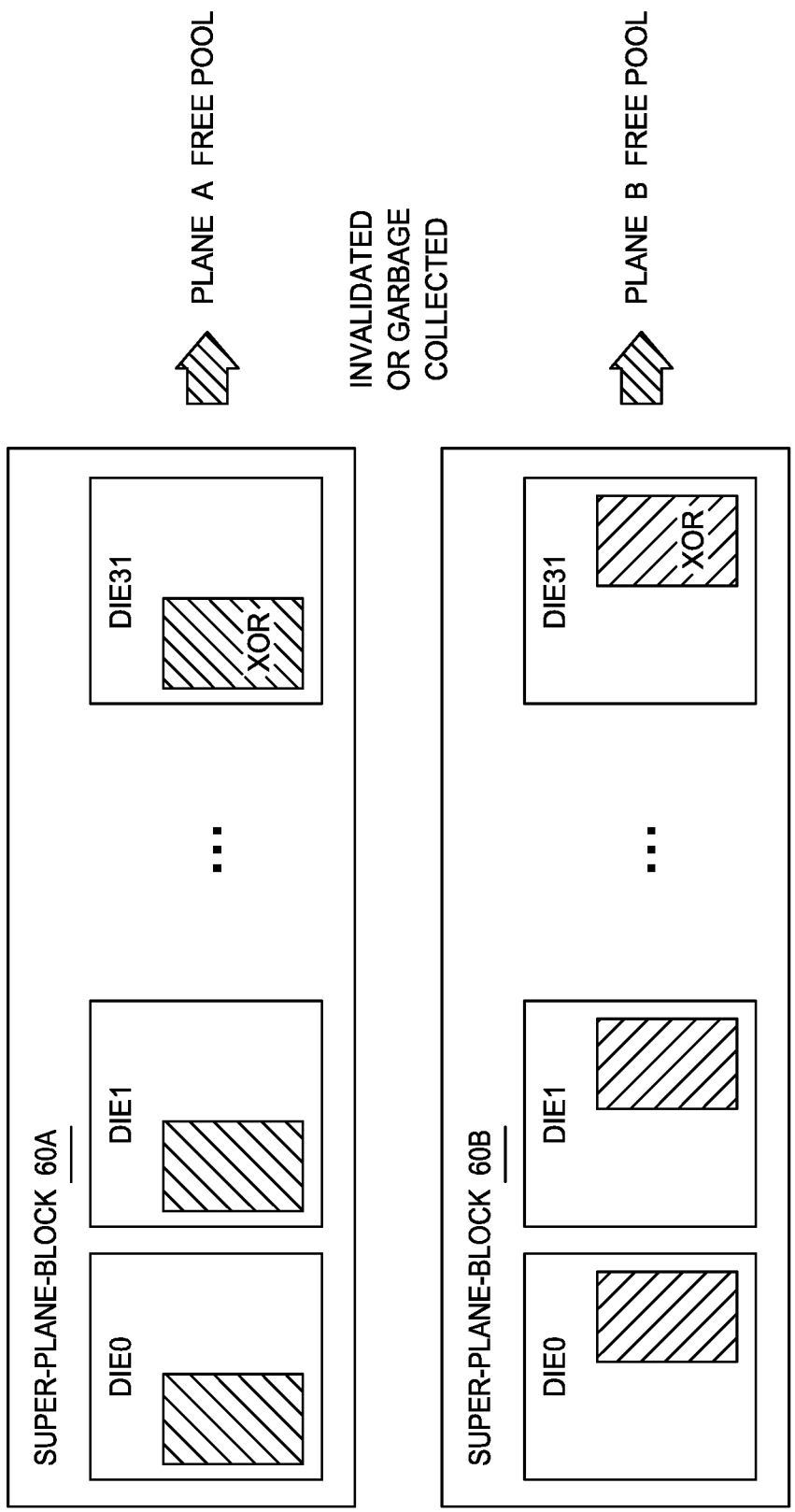
FIG. 7 is a schematic diagram of certain embodiments of a SSD structured with super-plane-blocks that can be independently invalidated/garbage collected or erased without garbage collection.

FIG. 7 is a schematic diagram of certain embodiments of a SSD structured with super-plane-blocks 60 that can be independently invalidated/garbage collected or erased without garbage collection, such as the super-plane blocks 60 of FIG. 5A and FIG. 5B and like numerals for elements are used for ease of description.

Super-plane-blocks 60A, 60B are independent. Super-plane block 60A can be invalidated/garbage collected or erased without garbage collection independently of super-plane-block 60B or other super-plane-blocks if there are more than two super-plane-blocks (i.e., four, six, eight or more super-plane-blocks) in the system 100. The independent invalidation/garbage collection or erasure can occur even if the data streams were written at the same time.

If host 101 overwrites or invalidates part of data stream 62A stored in a super-plane-block 60A, then the blocks 20 of the super-plane-block 60A may be garbage collected and erased and the free up blocks placed in the free block pool or free plane pool. Since two data streams are stored separately in super-plane-block 60A and in super-plane-block 60B, overwriting or invalidating data stream 62A written in super-plane-block 60A does not result in garbage collection of data stream 62B written in super-plane-block 60B. Overwriting or invalidating data stream 62B written in super-plane-block 60B does not result in garbage collection of data stream 62A written in super-plane-block 60A. Write amplification is reduced since valid data of one data stream isn't moved to a new block due to invalid data of another data stream.

Super-plane-blocks avoid SSD 102 writing multiple data streams in multiple superblocks 50 spanning the same plane 10 of FIG. 4. Writing all the data streams into the same plane 10 or superblock 50 will lead to garbage collection of the other valid data streams if one particular data stream is overwritten by new data. The write amplification factor becomes greater in than 1 and can become as high as the case for random workloads if multiple data streams are written to multiple superblocks 50 spanning the same plane 10 of FIG. 4.

Figure 8:
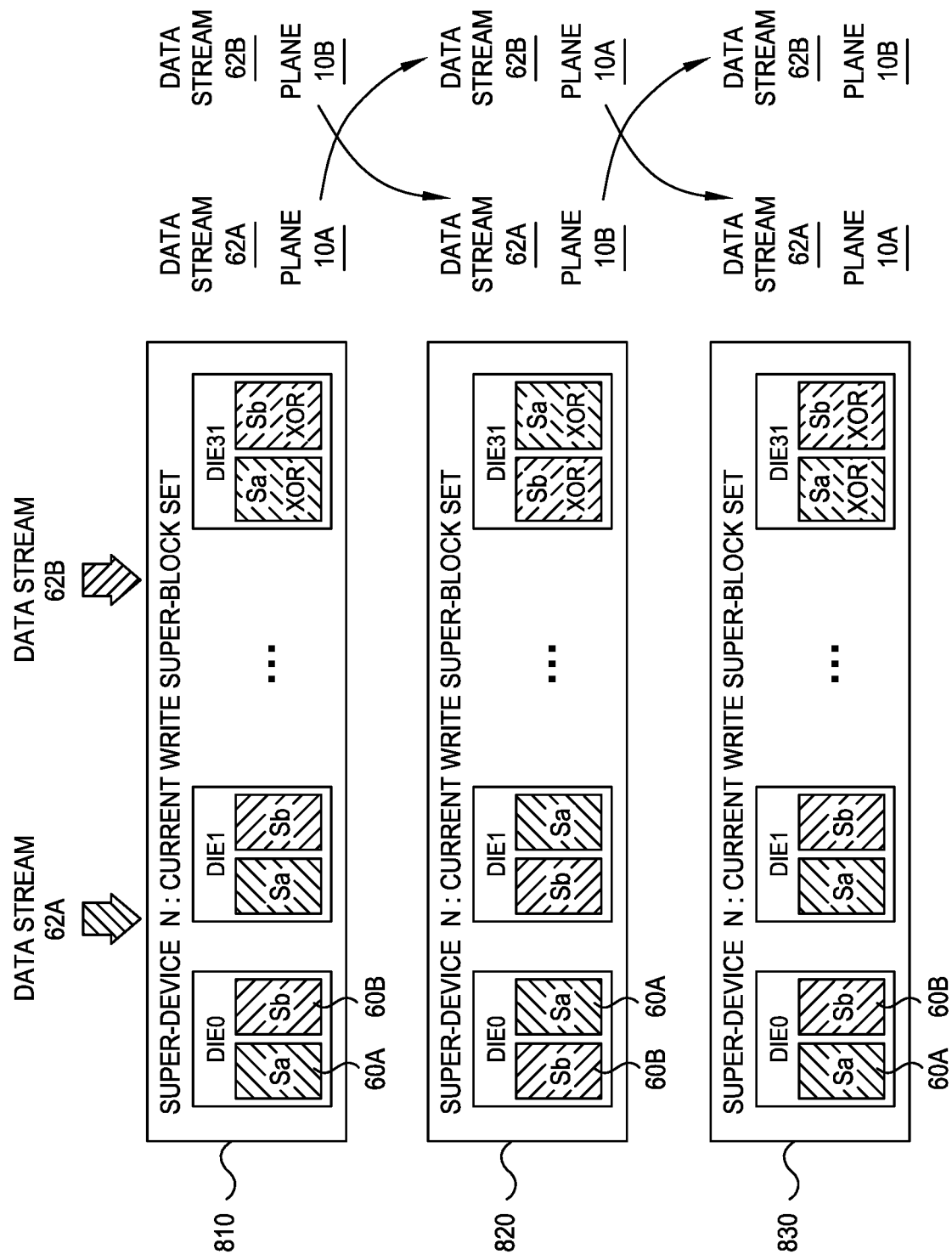
FIG. 8 is a schematic diagram illustrating certain embodiments of swapping streams between planes.

FIG. 8 is a schematic diagram illustrating certain embodiments of randomizing streams between planes 10, such as the planes 10 of FIG. 5A and FIG. 5B. and like numerals for elements are used for ease of description. When super-plane-block 60 is formed and mapped to a data stream, plane 10 of the super-plane-block 60 is changed/or randomized to help with wear leveling among dies 111 of NVM 110. Randomizing the data streams between the planes reduces a single data stream from dominating any particular plane and causing uneven wear of a plane or uneven operations to a plane.

For example, a first super-device 810 is formed from two super-plane-blocks 60A, 60B from across dies 111. Data stream 62A is written to super-pane-block 60A across plane 10A of the dies and data stream 62B is written to super-plane-block 60B across plane 10B of dies 111. After one or both super-plane-blocks 60 of first super-device 810 are erased and in the plane free pool, a second super-device 820 is formed from two super-plane-blocks 60A, 60B from across the NVM dies. Data stream 62A is written to super-pane-block 60A across plane 10B of the dies 111 and data stream 62B is written to super-plane-block 60B across plane 10A of the dies. After one or both the super-plane-blocks 60 of the second super-device 820 are erased and in the plane free pool, a third super-device 830 is formed form two super-plane-blocks 60A, 60B from across the dies 111. Data stream 62A is written to super-pane-block 60A across plane 10A of dies 111 and data stream 62B is written to super-plane-block 60B across plane 10B of dies 111.

Although FIG. 8 shows data streams 62A, 62B alternatingly assigned to planes 10A, 10B after a new super-device is formed, the data streams 62A, 62B may be assigned to a randomized plane (i.e., the same plane or different plane from the prior super-device.)

Figure 9:
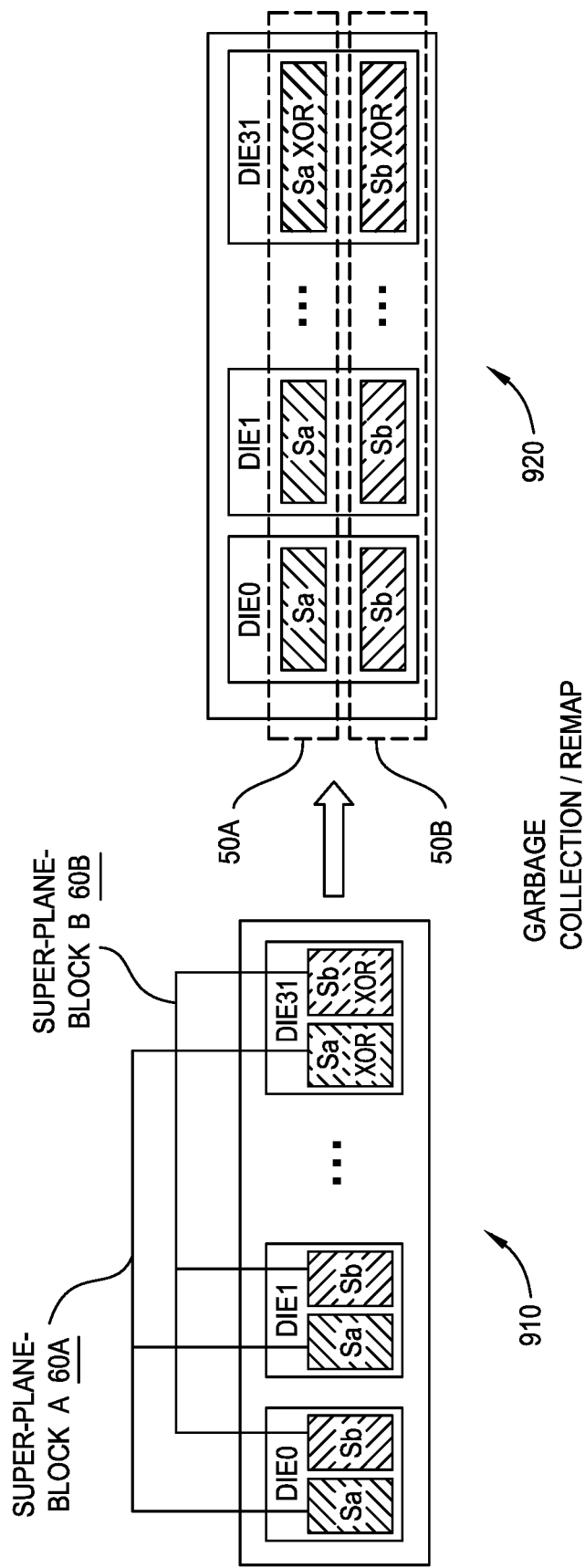
FIG. 9 is a schematic diagram illustrating certain embodiments of a SSD super-plane-blocks being merged into superblocks.

FIG. 9 is a schematic diagram illustrating certain embodiments of super-plane-blocks (such as super-plane-blocks 60 of FIGS. 5A-5B) being merged into superblocks (such as the superblocks 50 of FIG. 4), and like numerals for elements are used for ease of description. An initial write 910, separately writes data stream A and data stream B to super-plane-blocks 60A, 60B of the NVM 110.

In certain embodiments, a subsequent write 920 of the NVM, such as when the super-plane-blocks 60A, 60B have been closed or completely written to, remaps the super-plane-blocks 60A, 60B into superblocks 50A, 50B striped across all planes 10 of dies 111 with zero data relocation from garbage collection. The remapped data stream into a superblock 50A, 50B keeps the stream data together which are likely to be invalidated together.

In certain embodiments, a subsequent write 920 of the NVM, such as when the data stream 62A stored in super-plane-block 60A is randomly invalidated, garbage collection is performed of super-plane-block 60A with valid data moved into superblock 50A. If data stream 62B stored in super-plane-block 60B is randomly invalidated, garbage collection is performed on super-plane-block 60B with valid data moved into superblock 50B. If data stream 62B stored in super-plane-block 60B is closed or completely written to, super-plane-block 60B is remapped into a superblock 50B with zero data relocation from garbage collection.

Figure 10A:
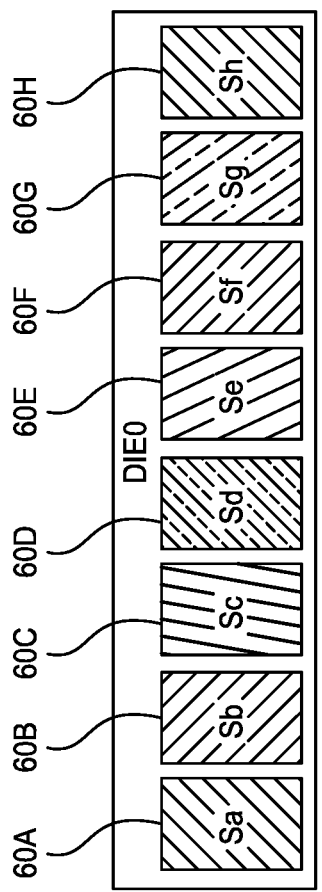
FIGS. 10A-10B are a schematic diagram illustrating certain embodiments of a SSD organized with eight plane dies having eight super-plane-blocks de-caching multiple data streams.
Figure 10B:
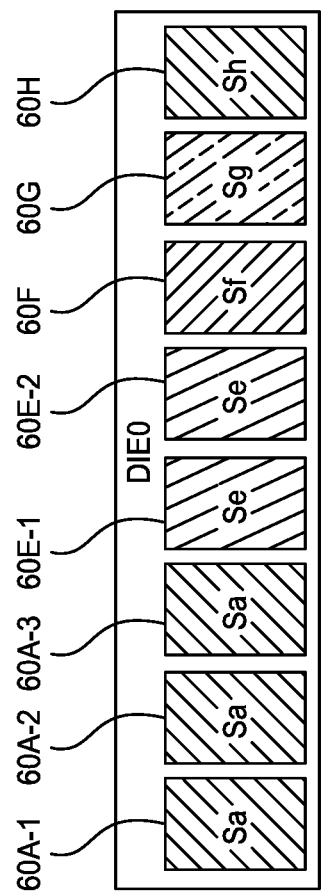

FIGS. 10A-10B are schematic diagrams illustrating certain embodiments of a SSD organized with eight plane dies having eight super-plane-blocks (such as super-plane blocks 60 of FIG. 5A and FIG. 5B) de-caching multiple data streams (such as a cache from host 101 or SSD 102), and like numerals for elements are used for ease of description.

FIG. 10A shows certain embodiments where eight data streams A-H are being written to the super-device at the same rate or approximately the same rate and are filling each super-plane-blocks 60A-60H at the same rate or approximately the same rate.

FIG. 10B shows certain embodiments where five data streams are being written to the super-device at different rates. The different rates may be caused by stalling of the data streams from the host 101 or various other factors causing some data dreams to be transmitted faster than other data streams. Controller 140 can assign a data stream to multiple super-plane-blocks 60 rather than just one super-plane-block. For example, as shown in FIG. 10B, a data stream A is being written at a faster rate than data stream E. Date stream E is being written at a faster rate than data stream F, data stream G, or data stream H. Data stream A is assigned to three super-plane-blocks 60A-1, 60A-2, 60A-3. Data stream E is assigned to two super-plane-blocks 60E-1, 60E-2. Data streams F, G, H are assigned to one super-plane-block 60F, 60G, 60H respectively.

The number of parallel data streams written to the super-device of super-plane blocks 60 is a function of the number of planes 10 of user data dies 72 of the super-device. If the user data dies 72 have two planes 10, than two parallel data streams or one data stream may be written to the super-device of super-plane blocks 60. If the user data dies 72 have four planes 10, than four to two parallel data streams or one data stream may be written to the super-device of super-plane blocks 60. If the user data dies 72 have six planes 10, than six to two parallel data streams or one data stream may be written to the super-device of super-plane blocks. If the user data dies 72 have eight planes 10, than eight to two parallel data streams or one data stream may be written to the super-device of super-plane blocks. SSD 102 writing each data stream separately into in one or more planes 10 provides that any overwrite of a given data stream does not result in garbage collection of the other data streams, thus reducing write amplification.

Figure 11:
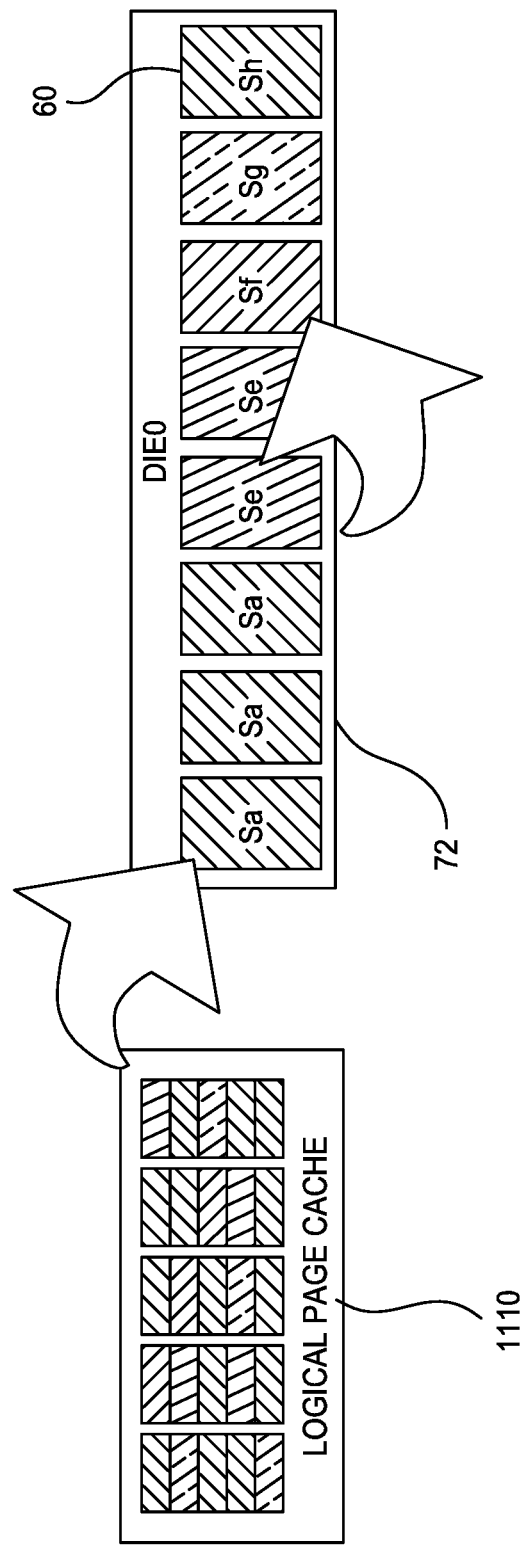
FIG. 11 is a schematic diagram illustrating certain embodiments of a SSD structured with a smaller logical page cache reduced due to improved efficiency provided by super-plane-blocks of the NVM.

FIG. 11 is a schematic diagram illustrating certain embodiments of a SSD structured with a smaller logical page cache reduced due to improved efficiency provided by super-plane-blocks 60 of the NVM. In certain embodiments, NVM 110 (i.e., NAND cached in SLC memory cells), volatile memory 130 (i.e., DRAM/SRAM cached), and/or volatile memory of host 101 is used as a logical page cache 1110. The performance of the system 100 is a function of how efficiently the logical page cache 1110 can be used. The cost of the system 100 is inverse to the size of the logical page cache 1110. It is desirable that the logical page cache 1110 is small due to cost, but small logical page cache 1110 may be inefficient at extracting the multiple data streams to user data dies 72 of the NVM 110 for long term storage. Multiple pages of data per data stream is required to be extract to NVM 110 of NAND memory cells for efficient operation of the NAND memory cells.

In certain embodiments, user data dies 72 comprises memory cells have storing higher bits per cell, such as QLC, TLC, or MLC memory cells. The user date die 72 with high data storage capacity enables the entire logical page cache 1110 to be flushed to the super-plane-blocks 60 of the user data dies 72 of the SSD. In certain embodiments, the entire super-plane-blocks 60 worth of multiple data streams can be flushed to the SSD. Each super-plane-block 60 can be treated as an erasable unit that is erased together in case the entire data stream in the super-plane-block is overwritten or invalidated. Super-plane-blocks 60 have the attribute of high performance due to interleaving of the data streams across different planes and have the attribute of an erasable unit with a reduced size as a function of the number of planes of the die. The amount of data needed to be staged in logical page cache 1110 per data stream is reduced. For a slow data stream (or where all streams write at the same rate or approximately the same rate), the minimum amount of data needed to be coalesced in the logical page cache 1110 to fill an erasable unit of NAND memory devices is reduced by the number of planes 10 in the die 111 (i.e., reduced by a factor of eight in eight plane NAND). In caparison, an erasable unit of superblock 50 of FIG. 4 increases in size with the number of planes.

Since user data dies 72 comprising memory cells storing higher bits per cells, such as QLC, TLC, or MLC memory cells, have a higher capacity, the logical page cache 1110 can be made smaller since the entire contents of the logical page cache 1110 can be flushed to the user data dies 72 of the NVM into super-plane-blocks 60 without die contention.

Figure 12:
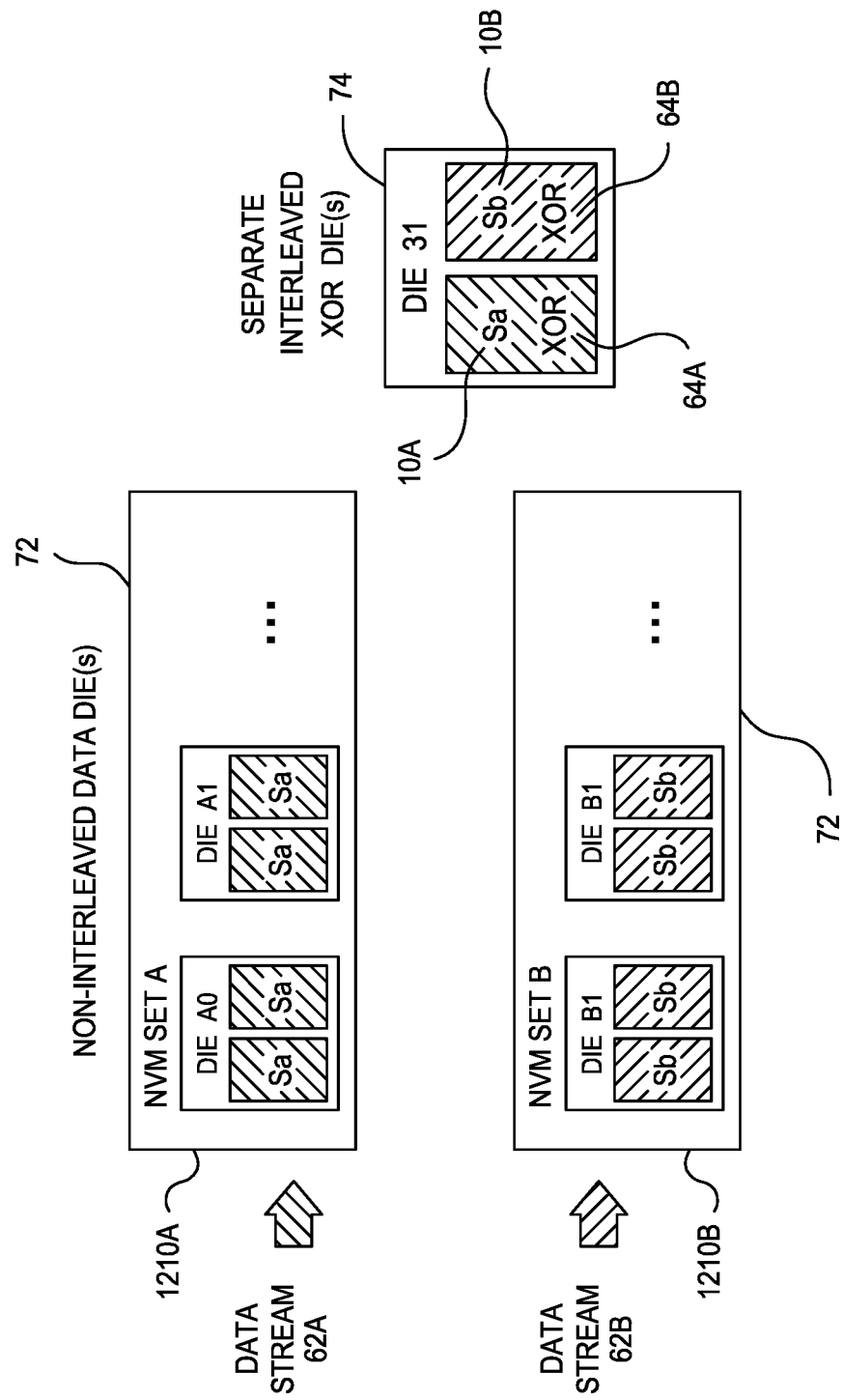
FIG. 12 is a schematic diagram illustrating certain embodiments of writing parity information of data streams on separate planes of a XOR die(s).

FIG. 12 is a schematic diagram illustrating certain embodiments of writing parity information of data streams on separate planes 10A, 10B or on a separate set of planes of XOR die(s) 74, such as the super-plane blocks 60 of FIG. 5A and FIG. 5B. and like numerals for elements are used for ease of description. Different data streams 62A, 62B are written to different user data dies 72 but the parity information 64A, 64B is stored on the same XOR die(s) 74 but on different planes 10 or on a different set of planes. The data streams 62A, 62B are not interleaved, but the parity information 64A, 64B is interleaved. The parity information 64A, 64B is kept separate from the user data dies 72 to provide full die redundancy. The parity information 64A, 64B is interleaved on different planes 10A, 10B or on a different set of planes of a XOR die or set of XOR dies to remove die contention of the XOR die(s). For example, for a XOR die having more than two planes (such as a four plane NAND die or an eight plane NAND die), parity information 64A is written on a first set of planes, and the parity information 64B is written on a second set of planes different from the first set of planes.

Different user data dies 72 may be required due to structuring the NVM 110 in different NVM sets 1210A, 1210B of dies 111 to provide quality of service isolated regions where operations to one die does not impact the operations of the other die. The NVM sets 1210A, 1210B as set forth in FIG. 12 provide full die redundancy and increased performance of the XOR die by interleaving the XOR parity information on separate planes 10A, 10B on XOR die(s) 74.

Interleaving parity information 64A, 64B of data streams 62A, 62B on different planes 10A, 10B or on a different set of planes removes die contention during operations to XOR die(s) 74. In addition, parity information 64A, 64B of data streams 62A, 62B on different planes 10A, 10B or on a different set of planes reduces garbage collection and write amplification of XOR die(s) 74. For example, if part of the data stream 62A stored in NVM set 1210A is overwritten or updated, the parity information 64A is updated without causing garbage collection of the parity information 64B of data stream 62B. If part of the data stream 62B stored in NVM set 1210B is overwritten or updated, the parity information 64B is updated without causing garbage collection of the parity information 64A of data stream 62A. Also, writing parity information 64A, 64B on separate planes 10A, 10B or on a separate set of planes of XOR die(s) 74 avoids XORing together the parity information of different data streams 62A, 62B and deXORing the parity information of different data streams in the cause of data recovery.

Certain embodiments of structuring non-volatile memory can extend the endurance, reliability, and/or performance of solid-state devices supporting multiple data streams. In certain embodiments, workloads of multiple data streams to super-plane-blocks spanning different planes of the user data dies and/or XOR die(s) reduces the write amplification factor. Overwriting or updating of one data stream does not cause garbage collection of another data stream and/or of the parity information of another data stream. In certain embodiments, workloads of multiple data streams to super-plane-blocks spanning different planes of the user data dies and/or XOR die(s) reduces die contention of writing to the same plane. Writes of different data streams can occur simultaneously or concurrently to different planes of the die without causing swapping back and forth between executions of the data stream writes to the same plane. In certain embodiments, workloads of multiple data streams to super-plane-blocks spanning different planes of the user data dies and/or XOR die(s) reduces the erasable unit of super-plane-blocks. As the number of planes of the dies increased, the erasable unit of an entire super-plane-block that can be erased together is smaller. A smaller erasable unit is desirable in enterprise applications utilizing NAND memory cells storing higher bits per cell, such as QLC memory cells. The smaller erasable unit allows a smaller unit of data from the data stream to be stored to cache prior to being flushed to the super-plane-block. Erasing an entire super-plane-block avoids garbage collection and provides improved endurance due to the lower write amplification. In certain embodiments, workloads of multiple data streams to super-plane-blocks spanning different planes of the XOR die(s) simplifies XOR operations and data recovery in the event of failure of the user dies. Updating the parity information of one data stream does not cause garbage collection of the parity information of another data stream. Writing combined parity information of multiple data streams onto separate planes of the XOR die(s) avoids XORing/deXORing operations of the combined parity information. In certain embodiments, workloads of multiple data streams to super-plane-blocks spanning different planes of the user data dies and/or XOR die(s) reduces the size and the cost of the data stream cache. An entire data stream cache be flushed to the super-plane-blocks providing greater efficiency of the data stream cache.

In one embodiment, a solid state device includes a controller and a non-volatile memory. The non-volatile memory includes a plurality of dies. Each die includes a plurality of planes. A first super-plane-block is structured from a first plane of the plurality of dies. A second super-plane-block is structured from a second plane of the plurality of dies. A plurality of memory operation instructions that, when executed by the controller, cause the controller to receive a first data stream, write the first data stream to the first super-plane-block, receive a second data stream, and write the second data stream to the second super-plane-block.

In another embodiment, a solid state device includes a controller, a data stream support means, and a plurality of memory operation instructions. The data stream support means is for simultaneously writing separate data on NAND flash memory. The plurality of memory operation instructions that, when executed by the controller, cause the controller to simultaneously write separate data to the data stream support means.

In one embodiment, a method of operating a solid state device includes structuring a non-volatile memory into a first super-plane-block and a second super-plane-block. The first super-plane-block is structured from a first plane of a plurality of dies and the second super-plane-block is structured from a second plane of the plurality of dies. A first data stream is written to the first super-plane-block. A second data stream is written to the second super-plane-block.

In another embodiment, a method of operating a solid state device includes providing a non-volatile memory comprising a plurality of dies having multiple planes. The non-volatile memory is structured into a plurality of super-plane-blocks. Each super-plane-blocks spans separate planes of the plurality of dies. A plurality of data streams is written into the plurality of super-plane-blocks.

In still another embodiment, a method of operating a solid state device include providing a non-volatile memory comprising a plurality of user data dies and a XOR die. A parity information of a first data stream is written on a first plane of the XOR die. A parity information of a second data stream is written on a second plane of the XOR die.

While the foregoing is directed to embodiments of the present disclosure, other and further embodiments of the disclosure may be devised without departing from the basic scope thereof, and the scope thereof is determined by the claims that follow.

What is claimed is:
1. A solid state device, comprising:
a controller;
a non-volatile memory comprising a plurality of dies, each die comprising a first plane and a second plane;
a first super-plane-block structured from the first plane of the plurality of dies;
a second super-plane-block structured from the second plane of the plurality of dies; and
a plurality of memory operation instructions that, when executed by the controller, cause the controller to:
receive a first data stream;
write the first data stream to the first super-plane-block;
receive a second data stream;
write the second data stream to the second super-plane-block;
invalidate data of the first super-plane-block; and
erase the first super-plane-block without causing garbage collection of the second super-plane-block.

2. The solid state device of claim 1, wherein the plurality of memory operation instructions further cause the controller to write a first parity information of the first data stream to a first plane of a XOR die of the first super-plane-block and writing a second parity information of the second data stream to a second plane of the XOR die of the second super-plane-block.

3. The solid state device of claim 1, wherein the plurality of memory operation instructions further cause the controller to simultaneously write the first data stream to the first super-plane-block and second data stream to the second super-plane-block.

4. The solid state device of claim 1, wherein the plurality of dies comprises quad-level memory cells.

5. The solid stated device of claim 1, wherein the first super-plane-block and the second super-plane-block form erasable units.

6. The solid state device of claim 1, further comprising a logical page cache, wherein the plurality of memory operation instructions further cause the controller to flush the first data stream to the first super-plane block and to flush the second data stream to the second super-plane-block.

7. A solid state device, comprising:
a non-volatile memory comprising a plurality of dies having multiple planes; and
a controller coupled to the non-volatile memory configured to:
structure the non-volatile memory into a plurality of super-plane-blocks, each super-plane-block spanning separate planes of the plurality of dies;
cache a plurality of data streams to a logical page cache;
flush the logical page cache in a size to substantially fill the one or more of the plurality of super-plane-blocks; and
write a plurality of data streams from the logical page cache into the plurality of super-plane-blocks, wherein each data stream of the plurality of data streams is written to one or more separate super-plane-blocks of the plurality of super-plane-blocks.

8. The solid state device of claim 7, wherein the number of data streams written to the plurality of super-plane-blocks is equal to or less than the number of planes.

9. The solid state device of claim 7, wherein the logical page cache is selecting from a host cache, a SSD SRAM cache, a SSD DRAM cache, a SSD NAND flash cache, and combinations thereof.

10. The solid state device of claim 7, wherein the non-volatile memory comprises a plurality of user data dies and a XOR die, wherein the controller is further configured to:
write a parity information of a first data stream on a first plane of the XOR die; and write a parity information of a second data stream on a second plane of the XOR die.

11. The solid state device of claim 10, wherein the controller is further configured to:
structure the non-volatile memory into a first super-plane-block and a second super-plane-block, the first super-plane-block spanning across a first plane of each user data dies and the second super-plane-block spanning across a second plane of each user data dies;
write the first data stream to the first super-plane-block; and
write the second data stream to the second super-plane-block.

12. The solid state device of claim 11, wherein the first data stream and the second data stream are interleaved on the plurality of user data dies and wherein the parity information of the first data stream and the parity information of the first data stream are interleaved on first plane and the second plane of the XOR die.

13. A solid state device, comprising:
a non-volatile memory comprising a plurality of user data dies having multiple planes and a XOR die having multiple planes; and
a controller coupled to the non-volatile memory configured to:
structure the non-volatile memory into a first super-plane-block and a second super-plane-block, the first super-plane-block spanning across a first plane of the multiple planes of each of the user data dies and across a first plane of the multiples planes of the XOR die, the second super-plane-block spanning across a second plane of the multiple planes of each of the user data dies and across a second plane of the multiples planes of the XOR die;
write a first data stream to the first super-plane-block;
write a second data stream to the second super-plane-block;
write a parity information of the first data stream on the first plane of the multiple planes of the XOR die;
write a parity information of the second data stream on the second plane of the multiple planes of the XOR die;
invalidate the parity information of the first data stream written to the first super-plane-block; and
erase the parity information of the first data stream without causing garbage collection of the parity information of the second data stream.

14. A solid state device, comprising:
a controller;
a data stream support means for simultaneously writing separate data from two separate data streams on NAND flash memory; and
a plurality of memory operation instructions that, when executed by the controller, cause the controller to simultaneous write separate data to the data stream support means wherein invalidation of the separate data of one of the two separate data streams causes erasure of the separate data of the one of the two separate data streams without garbage collection of the separate data of another of the two separate data streams.

15. The solid state device of claim 14, wherein the separate data is user data from the two separate data streams.

16. The solid state device of claim 14, wherein the separate data is parity information from the two separate data streams.

17. A solid state device, comprising:
a non-volatile memory comprising a plurality of dies, each die having a first plane and a second plane; and
a controller comprising a plurality of memory operation instructions that, when executed by the controller, cause the controller to:
structure the non-volatile memory into a first super-device comprising a first super-plane-block spanning the first planes of the dies and a second super-plane-block spanning the second planes of the dies;
write a first data stream into the first super-plane-block spanning the first planes of the first super-device and writing a second data stream into the second super-plane-block spanning the second planes of the first super-device;
structure the non-volatile memory into a second super-device comprising a first super-plane-block spanning the second planes of the dies and a second super-plane-block spanning the first planes of the dies; and
writing the first data stream into the first super-plane-block spanning the second planes of the second super-device and writing the second data stream into the second super-plane-block spanning the first planes of the second super-device.

* * * * *